United States Patent
Khandekar et al.

(10) Patent No.: US 8,457,260 B2
(45) Date of Patent: Jun. 4, 2013

(54) SYSTEM AND METHOD FOR ACQUISITION IN WIRELESS COMMUNICATION SYSTEMS

(75) Inventors: Aamod Khandekar, San Diego, CA (US); Alexei Gorokhov, San Diego, CA (US); Naga Bhushan, San Diego, CA (US); Ravi Palanki, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 964 days.

(21) Appl. No.: 11/944,866

(22) Filed: Nov. 26, 2007

(65) Prior Publication Data

US 2008/0130770 A1 Jun. 5, 2008

Related U.S. Application Data

(60) Provisional application No. 60/868,525, filed on Dec. 4, 2006.

(51) Int. Cl.
 *H04L 27/08* (2006.01)
(52) U.S. Cl.
 USPC ............................................ 375/345
(58) Field of Classification Search
 USPC ............................................ 375/345
 See application file for complete search history.

(56) References Cited

U.S. PATENT DOCUMENTS

| | | | |
|---|---|---|---|
| 6,216,004 B1 * | 4/2001 | Tiedemann et al. | 455/442 |
| 6,816,736 B2 | 11/2004 | Laroia et al. | |
| 7,463,872 B2 * | 12/2008 | Jin et al. | 455/245.1 |
| 7,822,153 B2 * | 10/2010 | Song et al. | 375/345 |
| 2006/0222118 A1 * | 10/2006 | Murthy et al. | 375/345 |
| 2006/0285485 A1 * | 12/2006 | Agrawal et al. | 370/208 |
| 2008/0002792 A1 * | 1/2008 | Shalev | 375/345 |

FOREIGN PATENT DOCUMENTS

| | | |
|---|---|---|
| CN | 1638368 A | 7/2005 |
| EP | 0496507 A2 | 7/1992 |
| EP | 1548958 | 6/2005 |
| EP | 1005204 B1 | 2/2006 |
| EP | 1798885 | 6/2007 |
| JP | 2003092561 A | 3/2003 |
| JP | 2003209477 A | 7/2003 |

(Continued)

OTHER PUBLICATIONS

International Search Report—PCT/US2007/085980, International Searching Authority—European Patent Office—Jul. 22, 2008.

(Continued)

*Primary Examiner* — Kevin Kim
(74) *Attorney, Agent, or Firm* — James K. O'Hare (57) ABSTRACT

Techniques for supporting efficient operation by terminals in a wireless communication system are described. A base station transmits a preamble periodically in each superframe. The preamble includes at least one first OFDM symbol for control information followed by at least one second OFDM symbol for paging information. A terminal receives the first and second OFDM symbols and determines a receiver gain based on the received power of the first OFDM symbol(s), e.g., with an AGC loop having a shorter time constant than the duration of the first OFDM symbol(s). The terminal processes the second OFDM symbol(s) based on the receiver gain to obtain the paging information. The terminal may operate in an idle state, determine superframes assigned to the terminal, sleep between the assigned superframes, and process the first and second OFDM symbols in each assigned superframe to obtain the paging information.

30 Claims, 7 Drawing Sheets

FOREIGN PATENT DOCUMENTS

| | | |
|---|---|---|
| JP | 2008533876 | 8/2008 |
| RU | 2003131394 | 4/2005 |
| WO | WO2005074184 A2 | 8/2005 |
| WO | WO2006099530 A2 | 9/2006 |
| WO | 2006123557 | 11/2006 |
| WO | 2007117723 | 10/2007 |
| WO | 2007118101 | 10/2007 |

OTHER PUBLICATIONS

Written Opinion—PCT/US2007/085980, International Searching Authority—European Patent Office—Jul. 22, 2008.

TIA-1121.001 "Physical Layer for Ultra Mobile Broadband (UMB) Air Interface Specification," 3GPP2 C.S0084-001Version 2.0, (Aug. 2007).

TIA-1121.002 "Medium Access Control Layer For Ultra Mobile Broadband (UMB) Air Interface Specification," 3GPP2 C.S0084-002, Version 2.0 (Aug. 2007).

Taiwan Search Report—TW096146161—TIPO—Aug. 12, 2011.

Update on superframe preamble structure in LBC FDD, Michel Wang, Aamod Khandekhar QUALCOMM Incorporated, United States, Oct. 2006.

* cited by examiner

SYSTEM AND METHOD FOR ACQUISITION IN WIRELESS COMMUNICATION SYSTEMS

The present application claims priority to provisional U.S. Application Ser. No. 60/868,525, entitled "SYSTEM AND METHOD FOR ACQUISITION IN WIRELESS COMMUNICATION SYSTEMS," filed Dec. 4, 2006, assigned to the assignee hereof and incorporated herein by reference.

BACKGROUND

I. Field

The present disclosure relates generally to communication, and more specifically to acquisition techniques in wireless communication systems.

II. Background

Wireless communication systems are widely deployed to provide various communication services such as voice, video, packet data, messaging, broadcast, etc. These wireless systems may be multiple-access systems capable of supporting multiple users by sharing the available system resources. Examples of such multiple-access systems include Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc.

A wireless communication system may broadcast various types of control information in order to support operation on the system. It is desirable to broadcast the control information as reliably and efficiently as possible in order to improve system performance. Furthermore, it is desirable to broadcast the control information such that terminals in the system can operate efficiently.

There is therefore a need in the art for techniques to efficiently broadcast and use control information in a wireless communication system.

SUMMARY

Techniques for supporting efficient operation by terminals in idle state are described herein. In one design, a base station may transmit a preamble periodically in each superframe of a predetermined time duration. A preamble is a portion of a forward link transmission and carries control and/or other information. A preamble for a superframe may include at least one first orthogonal frequency division multiplexed (OFDM) symbol for a broadcast control channel followed by at least one second OFDM symbol for a paging related channel.

In one design, a terminal may receive the first and second OFDM symbols in a superframe preamble and may determine the received power of the at least one first OFDM symbol. The terminal may then determine a receiver gain based on the received power of the at least one first OFDM symbol, e.g., with an automatic gain control (AGC) loop having a time constant that is shorter than the duration of the at least one first OFDM symbol. The terminal may process the at least one second OFDM symbol based on the receiver gain to obtain paging information. The use of the at least one first OFDM symbol to determine the receiver gain may improve demodulation performance of the at least one second OFDM symbol while reducing the amount of time the terminal is awake to receive the paging information.

The terminal may operate in the idle state and may determine superframes assigned to the terminal. The terminal may sleep between the assigned superframes and may process the first and second OFDM symbols in the preamble of each assigned superframe to obtain paging information. The paging information may indicate whether a page is being sent or is potentially sent to the terminal. The terminal may perform appropriate action based on the paging information, e.g., remain awake to receive a page or go back to sleep if no action is required.

Various aspects and features of the disclosure are described in further detail below.

DETAILED DESCRIPTION

Figure 1:
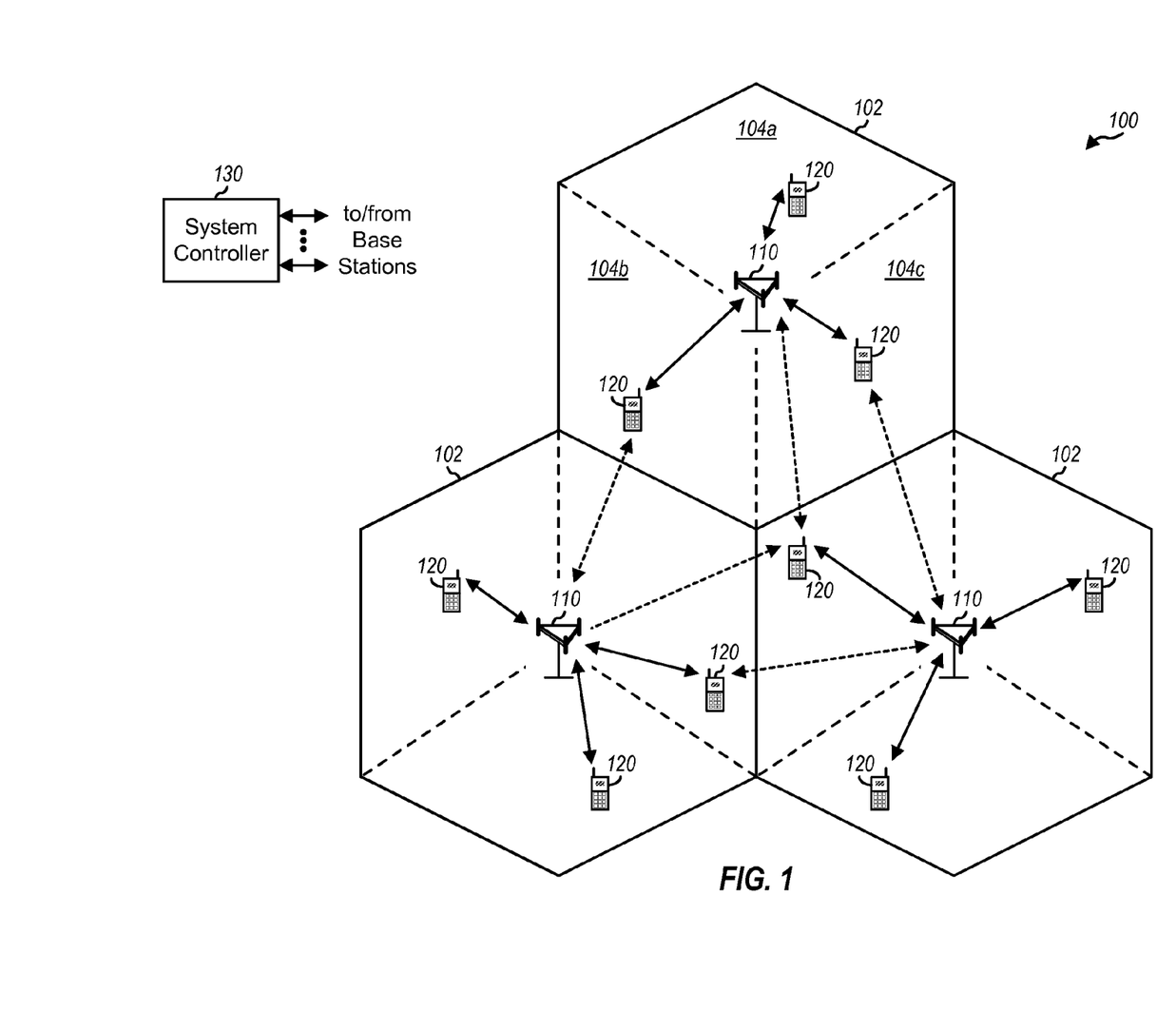
FIG. 1 shows a wireless communication system.

FIG. 1 shows a wireless communication system 100 with multiple base stations 110 and multiple terminals 120. A wireless system may also be referred to as an access network (AN). The terms "system" and "network" are often used interchangeably. A base station is a station that communicates with the terminals. A base station may also be referred to as an access point, a Node B, an evolved Node B, etc. Each base station 110 provides communication coverage for a particular geographic area 102. The term "cell" can refer to a base station and/or its coverage area depending on the context in which the term is used. To improve system capacity, a base station coverage area may be partitioned into multiple smaller areas, e.g., three smaller areas 104a, 104b, and 104c. Each smaller area may be served by a respective base station subsystem. The term "sector" can refer to the smallest coverage area of a base station and/or a base station subsystem serving this coverage area. The techniques described herein may be used for a system with sectorized cells as well as a system with un-sectorized cells. For simplicity, in the following description, the term "base station" is used generically for a station that serves a sector as well as a station that serves a cell.

Terminals 120 may be dispersed throughout the system, and each terminal may be stationary or mobile. A terminal may also be referred to as an access terminal (AT), a mobile station, a user equipment, a subscriber unit, a station, etc. A terminal may be a cellular phone, a personal digital assistant (PDA), a wireless communication device, a wireless modem, a handheld device, a laptop computer, a cordless phone, etc. A terminal may communicate with zero, one, or multiple base stations on the forward and/or reverse links at any given moment. The forward link (or downlink) refers to the communication link from the base stations to the terminals, and the reverse link (or uplink) refers to the communication link from the terminals to the base stations.

For a centralized architecture, a system controller 130 may couple to base stations 110 and provide coordination and control for these base stations. System controller 130 may be a single network entity or a collection of network entities. For a distributed architecture, the base stations may communicate with one another as needed.

The techniques described herein may be used for various wireless communication systems such as CDMA, TDMA, FDMA, OFDMA, and SC-FDMA systems. A CDMA system may implement a radio technology such as cdma2000, Universal Terrestrial Radio Access (UTRA), etc. An OFDMA system may implement a radio technology such as Ultra Mobile Broadband (UMB), Evolved UTRA (E-UTRA), IEEE 802.16, IEEE 802.20, Flash-OFDM®, etc. UTRA and E-UTRA are described in documents from an organization named "3rd Generation Partnership Project" (3GPP). cdma2000 and UMB are described in documents from an organization named "3rd Generation Partnership Project 2" (3GPP2). These various radio technologies and standards are known in the art. For clarity, certain aspects of the techniques are described below for UMB, and UMB terminology is used in much of the description below. UMB is described in 3GPP2 C.S0084-001, entitled "Physical Layer for Ultra Mobile Broadband (UMB) Air Interface Specification," and 3GPP2 C.S0084-002, entitled "Medium Access Control Layer For Ultra Mobile Broadband (UMB) Air Interface Specification," both dated August 2007 and publicly available.

Wireless communication system 100 may be an OFDMA system (e.g., a UMB system) and may utilize OFDM. OFDM partitions the system bandwidth into multiple (K) orthogonal subcarriers, which are also commonly referred to as tones, bins, etc. Each subcarrier may be modulated with data. The spacing between adjacent subcarriers may be fixed, and the number of subcarriers may be dependent on the system bandwidth. For example, there may be 128 subcarriers for a system bandwidth of 1.25 MHz, 256 subcarriers for 2.5 MHz, 512 subcarriers for 5 MHz, 1024 subcarriers for 10 MHz, 2048 subcarriers for 20 MHz, etc.

To generate an OFDM symbol, up to K modulation symbols may be mapped to subcarriers used for transmission, and zero symbols with signal values of zero may be mapped to remaining subcarriers not used for transmission. The K total symbols may be transformed to the time domain with a K-point inverse discrete Fourier transform (IDFT) to obtain K time-domain samples for a useful portion. The last C samples of the useful portion may be repeated and appended to the front of the useful portion to form an OFDM symbol containing K+C samples. The repeated portion is often referred to as a cyclic prefix, and C is the cyclic prefix length. The cyclic prefix is used to combat inter-symbol interference (ISI) caused by frequency selective fading. An OFDM symbol is transmitted in one OFDM symbol period, which may be K+C sample periods.

Wireless communication system 100 may utilize either FDD or TDD. With FDD, separate frequency channels are used for the forward and reverse links. A terminal may simultaneously receive data on a forward link (FL) frequency channel and transmit data on a reverse link (RL) frequency channel. With TDD, a single frequency channel is used for both the forward and reverse links. The transmission timeline may be partitioned into time intervals, with certain time intervals being used for the forward link and other time intervals being used for the reverse link. A terminal may transmit data on the single frequency channel in time intervals used for the reverse link and may receive data in time intervals used for the forward link.

Wireless communication system 100 may utilize various framing structures. A framing structure may indicate the manner in which traffic/packet data, control information, and pilot are sent on the forward and reverse links. Some exemplary framing structures are described below.

Figure 2:
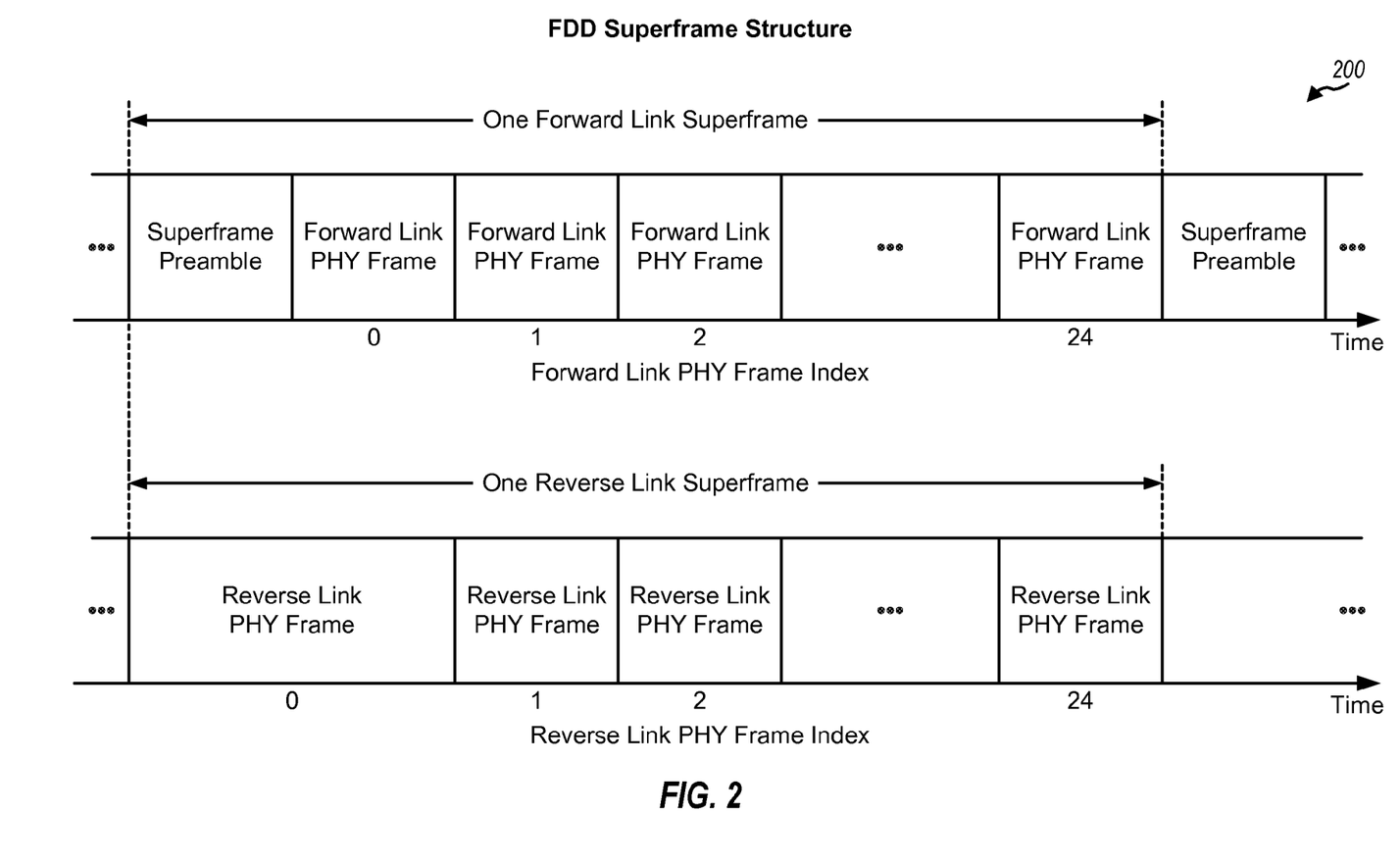
FIG. 2 shows a frequency division duplexed (FDD) superframe structure.

FIG. 2 shows a design of an FDD superframe structure 200 that may be used for system 100. The transmission timeline for each link may be partitioned into units of superframes. Each superframe may span a particular time duration, which may be fixed or configurable. For the forward link, each superframe may include a preamble followed by M physical layer (PHY) frames, where M may be any integer value. In the design shown in FIG. 2, each forward link superframe includes 25 PHY frames with indices of 0 through 24. In general, the term "frame" may refer to a time interval in a transmission timeline or a transmission sent during the time interval. The superframe preamble may carry control information and pilot, which may enable the terminals to receive forward link control channels and subsequently access the system. Control information may also be referred to as system information, broadcast information, overhead information, signaling, etc. Each PHY frame may carry traffic data, control information, pilot, etc.

For the reverse link, each superframe may also include M PHY frames. The first PHY frame on the reverse link may be extended by the length of the superframe preamble on the forward link. The superframes on the reverse link may be time aligned with the superframes on the forward link.

For FDD superframe structure 200, a base station may transmit data, control information, and pilot on each forward link PHY frame to one or more terminals. One or more terminals may transmit data, control information, and pilot on each reverse link PHY frame to the base station. The base station and a given terminal may simultaneously transmit and receive data via the forward and reverse links.

Figure 3:
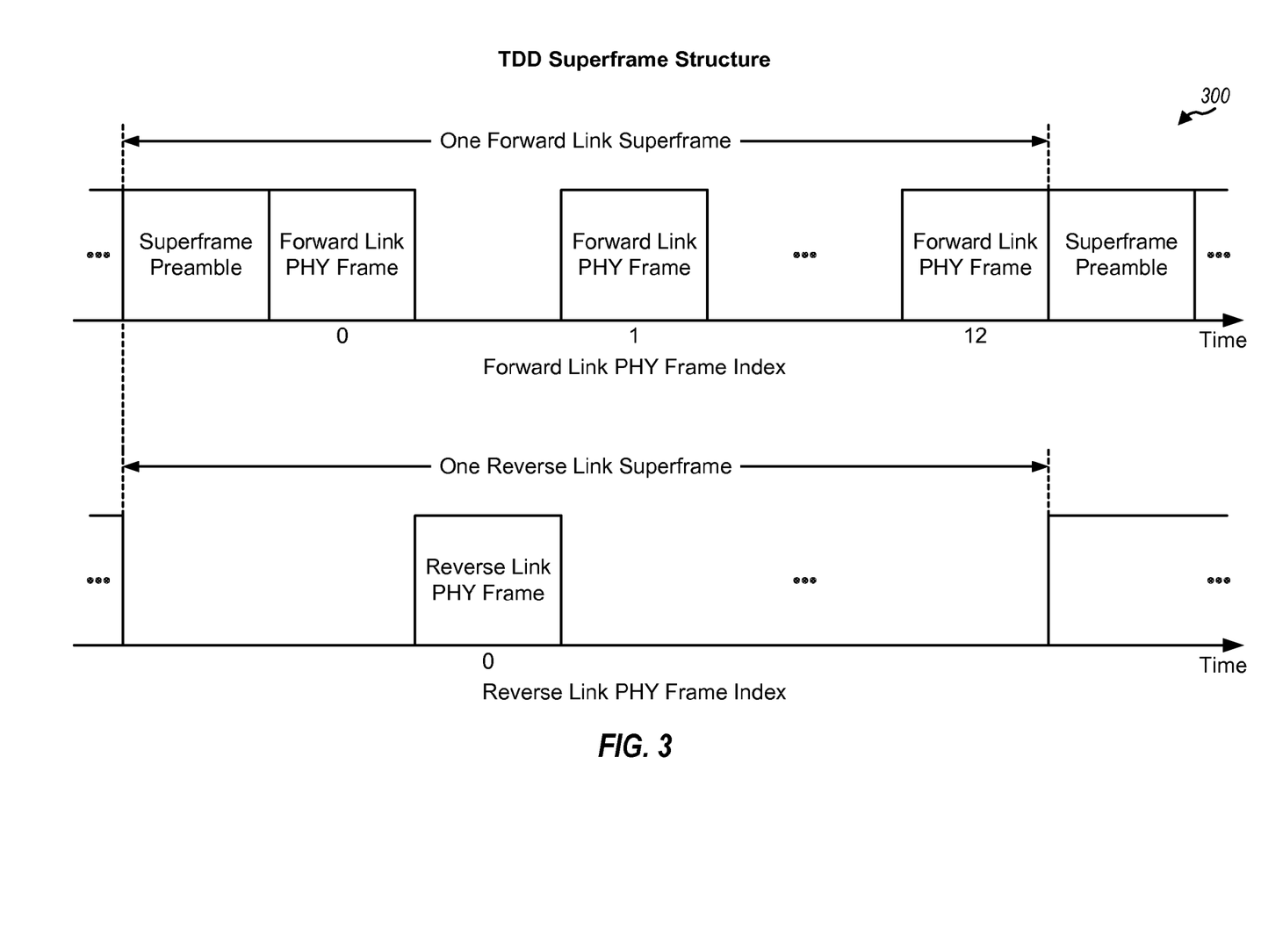
FIG. 3 shows a time division duplexed (TDD) superframe structure.

FIG. 3 shows a design of a TDD superframe structure 300 that may also be used for system 100. The transmission timeline may be partitioned into superframes, with each superframe including a preamble followed by M PHY frames, e.g., 25 PHY frames, as described above for the forward link superframe in FIG. 2. For each superframe, $M_{FL}$ PHY frames may be used for the forward link, and $M_{RL}$ remaining PHY frames may be used for the reverse link, where $M=M_{FL}+M_{RL}$. The M available PHY frames may be allocated to the forward and reverse links such that $N_{FL}$ consecutive PHY frames are used for the forward link, followed by $N_{RL}$ consecutive PHY frames for the reverse link, followed by $N_{FL}$ consecutive PHY frames for the forward link, and so on. In the example shown in FIG. 3, $N_{FL}=N_{RL}=1$, PHY frames with even-numbered indices are used for the forward link, and PHY frames with odd-numbered indices are used for the reverse link. In general, $M_{FL}$, $M_{RL}$, $N_{FL}$ and $N_{RL}$ may be any integer values and may vary from superframe to superframe. Furthermore, $N_{FL}$ and $N_{RL}$ may vary within a given superframe.

For TDD superframe structure 300, a base station may transmit data, control information, and pilot on each forward link PHY frame to one or more terminals. One or more terminals may transmit data, control information, and pilot on each reverse link PHY frame to the base station. A terminal may either transmit or receive, if at all, in a given PHY frame.

In general, a superframe may include any number of PHY frames, and each PHY frame may include any number of OFDM symbols. A superframe preamble may also include any number of OFDM symbols and may or may not be equal to a PHY frame. In one design, each superframe includes 25 PHY frames, each PHY frame includes eight OFDM symbols, and the superframe preamble also includes eight OFDM symbols.

As shown in FIGS. 2 and 3, for both FDD and TDD, each superframe may include a preamble at the start of the superframe. The superframe preamble may carry various control channels that may be used by the terminals for various purposes such as acquisition, paging, etc. Table 1 lists a set of control channels that may be sent in the superframe preamble in accordance with one design and provides a short description of each control channel.

TABLE 1

| Symbol | Channel | Description |
| --- | --- | --- |
| F-PBCCH | Forward Primary Broadcast Control Channel | Carry deployment-specific parameters such as cyclic prefix duration, number of guard subcarriers, superframe index, etc. |
| F-SBCCH | Forward Secondary Broadcast Control Channel | Carry sector-specific parameters such as hopping patterns, pilot structure, control channel structure, transmit antennas, multiplexing modes, etc. |
| F-QPCH | Forward Quick Paging Channel | Carry paging information such as ID of paged terminal, quick page IDs, paging indicators, etc. |
| F-ACQCH | Forward Acquisition Channel | Carry information to help the terminals with initial acquisition. |
| F-OSICH | Forward Other-Sector-Interference Channel | Carry an other-sector-interference (OSI) indication |

Figure 4:
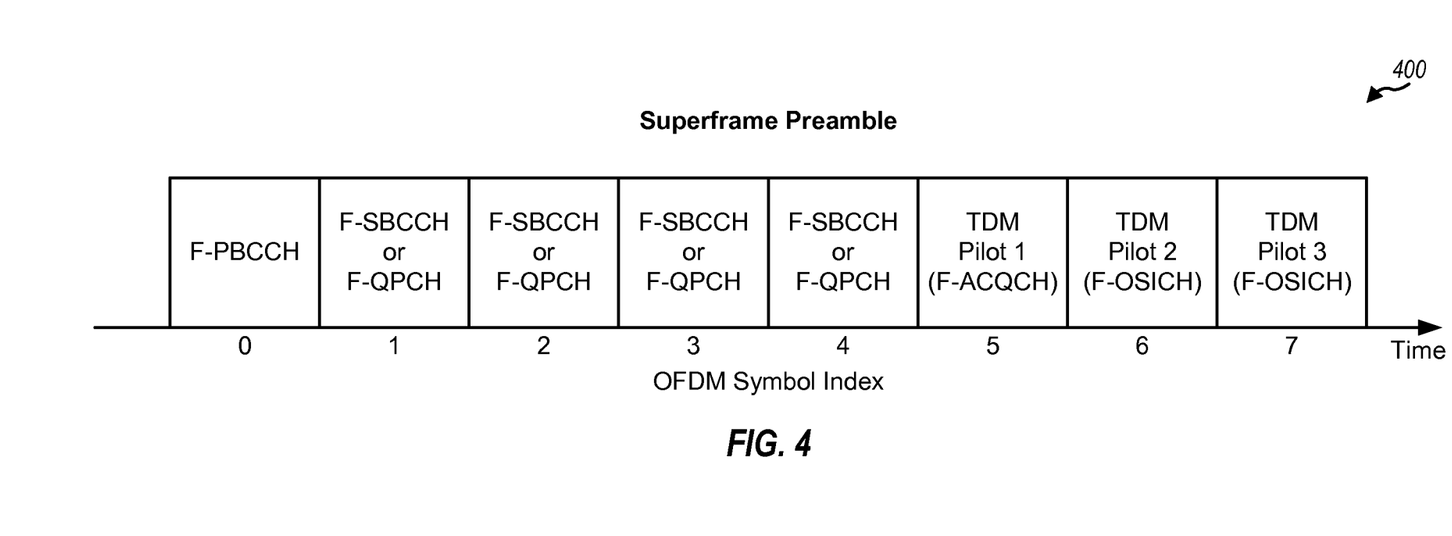
FIG. 4 shows a design of a superframe preamble.

FIG. 4 shows a design of a superframe preamble 400 that may be sent in each superframe. In this design, superframe preamble 400 includes eight OFDM symbols with indices of 0 through 7. The first OFDM symbol 0 carries information for deployment-specific parameters sent in the F-PBCCH. The deployment-specific parameters may also be referred to as system-specific information, deployment-wide static parameters, etc. The next four OFDM symbols 1 through 4 carry information for sector-specific parameters sent in the F-SBCCH as well as paging information sent in the F-QPCH. In one design, the F-SBCCH and F-QPCH are sent in alternate superframes. For example, the F-SBCCH may be sent in OFDM symbols 1 through 4 of superframes with even-number indices, and the F-QPCH may be sent in OFDM symbols 1 through 4 of superframes with odd-number indices. The F-SBCCH and F-QPCH may also be multiplexed and sent in other manners.

The next OFDM symbol 5 carries a first time division multiplexed pilot (TDM pilot 1), which may form the F-ACQCH. The next OFDM symbol 6 carries a second TDM pilot (TDM pilot 2), and the last OFDM symbol 7 carries a third TDM pilot (TDM pilot 3). The F-OSICH may be sent in TDM pilots 2 and 3. TDM pilots 1, 2 and 3 may be used by the terminals for initial acquisition and may be referred to as acquisition pilots.

FIG. 4 shows a specific design of superframe preamble 400. In general, a superframe preamble may include any number of OFDM symbols, e.g., 8, 16, 32, or some other number of OFDM symbols. The control channels and TDM pilots may be sent in the superframe preamble in other manners than the specific design shown in FIG. 4. For example, the F-PBCCH may be sent in one or more OFDM symbols and/or at other locations of the superframe preamble. Other control information may also be sent outside of the superframe preamble. For example, information on reverse link hopping patterns, channel mapping, transmit powers, power control parameters, access parameters, etc., may be sent using a regular data channel in predefined superframes.

A terminal may use the superframe preamble for initial acquisition. The terminal may first detect for the TDM pilots in order to determine symbol timing, frame timing, superframe timing, frequency error, sector identity (ID), and/or other information for a sector transmitting the superframe preamble. The terminal may use the OFDM symbol for the F-PBCCH and possibly the OFDM symbols for the F-SBCCH/F-QPCH for AGC to set the receiver gain when processing the TDM pilots for acquisition of time, frequency and sector ID. The terminal may next demodulate the F-PBCCH to obtain deployment-specific parameters, which may be used to demodulate other channels sent on the forward link. The terminal may then demodulate the F-SBCCH to obtain sector-specific parameters, which may be used for communication with the sector transmitting the superframe preamble. The terminal may next perform system access using all of the information gathered from the superframe preamble.

After accessing the system, the terminal may operate in an active state or an idle state. The terms "state" and "mode" are often used interchangeably. In the active state, the terminal may receive data on the forward link and/or transmit data on the reverse link. In the idle state, which may also be referred to as a sleep state or an inactive state, the terminal may not be exchanging data and may periodically monitor for pages. The terminal may transition between the active and idle states depending on whether there is any data to send or receive.

The F-PBCCH may carry deployment-specific parameters such as cyclic prefix duration, number of guard subcarriers, superframe index (or system time), etc., which may be applicable for the entire system or a group of sectors. The deployment-specific parameters may be relatively static and may change infrequently. One possible exception may be system time, which may be updated every 16 superframes or at some other rate. Since the deployment-specific parameters change slowly, a terminal may demodulate the F-PBCCH only once during initial acquisition to obtain the information sent on the F-PBCCH.

In one design of the F-PBCCH, a packet containing information for the deployment-specific parameters may be generated every Q superframes, where Q may be 16 or some other value. The packet may also be referred to as a system information block and may be processed (e.g., encoded and symbol mapped) to obtain a set of modulation symbols. An OFDM symbol may then be generated with the set of modulation symbols mapped to subcarriers used for the F-PBCCH. In one design, each sector may send the F-PBCCH on all usable subcarriers, and the OFDM symbols for the F-PBCCH from different sectors would interfere with one another. In another design, neighboring sectors may send the F-PBCCH on disjoint sets of subcarriers, and the OFDM symbols for the F-PBCCH from these neighboring sectors would not interfere with one another. In any case, a given sector may transmit the same OFDM symbol for the F-PBCCH in the preamble of each of Q consecutive superframes. The F-PBCCH may also be sent in other manners, e.g., a packet for the F-PBCCH may be processed and sent across Q superframes.

The F-SBCCH may carry sector-specific parameters such as hopping patterns, pilot structure, control channel structure, transmit antennas, etc., which may be applicable for a specific sector. The sector-specific parameters may be relatively static and may change infrequently. Hence, a terminal may demodulate the F-SBCCH only once during initial acquisition to obtain the information sent on the F-SBCCH.

The F-QPCH may carry paging information, which is any information that can aid a terminal to determine whether a page is being sent to the terminal. The paging information may comprise an ID of a terminal being paged, a portion of the IDs of the terminals being paged, etc. The paging information may also comprise paging indicators. Idle terminals may be mapped to specific paging indicators, and each paging indicator may be set (e.g., to '1') if any terminal mapped to that paging indicator is being paged. The paging information may also comprise other types of information to identify terminals being paged.

A terminal may operate in the idle state and may be assigned certain superframes in which paging information can be sent to the terminal. The terminal may sleep during the time between the assigned superframes to conserve battery power. The terminal may wake up during the preamble of each assigned superframe to monitor for paging information. The channel conditions may vary during the time that the terminal is asleep, and the received power may vary from one awake interval to the next. It is desirable to set the gain of a receiver to the proper value based on the received power so that good demodulation performance can be obtained.

In an aspect, an idle terminal may use the F-PBCCH for AGC whenever the terminal wakes up to receive paging information on the F-QPCH. Since the deployment-specific parameters may change very slowly, the terminal may not need to demodulate the F-PBCCH in each awake interval. The terminal may use the OFDM symbol for the F-PBCCH as a buffer symbol for AGC purpose.

Figure 5:
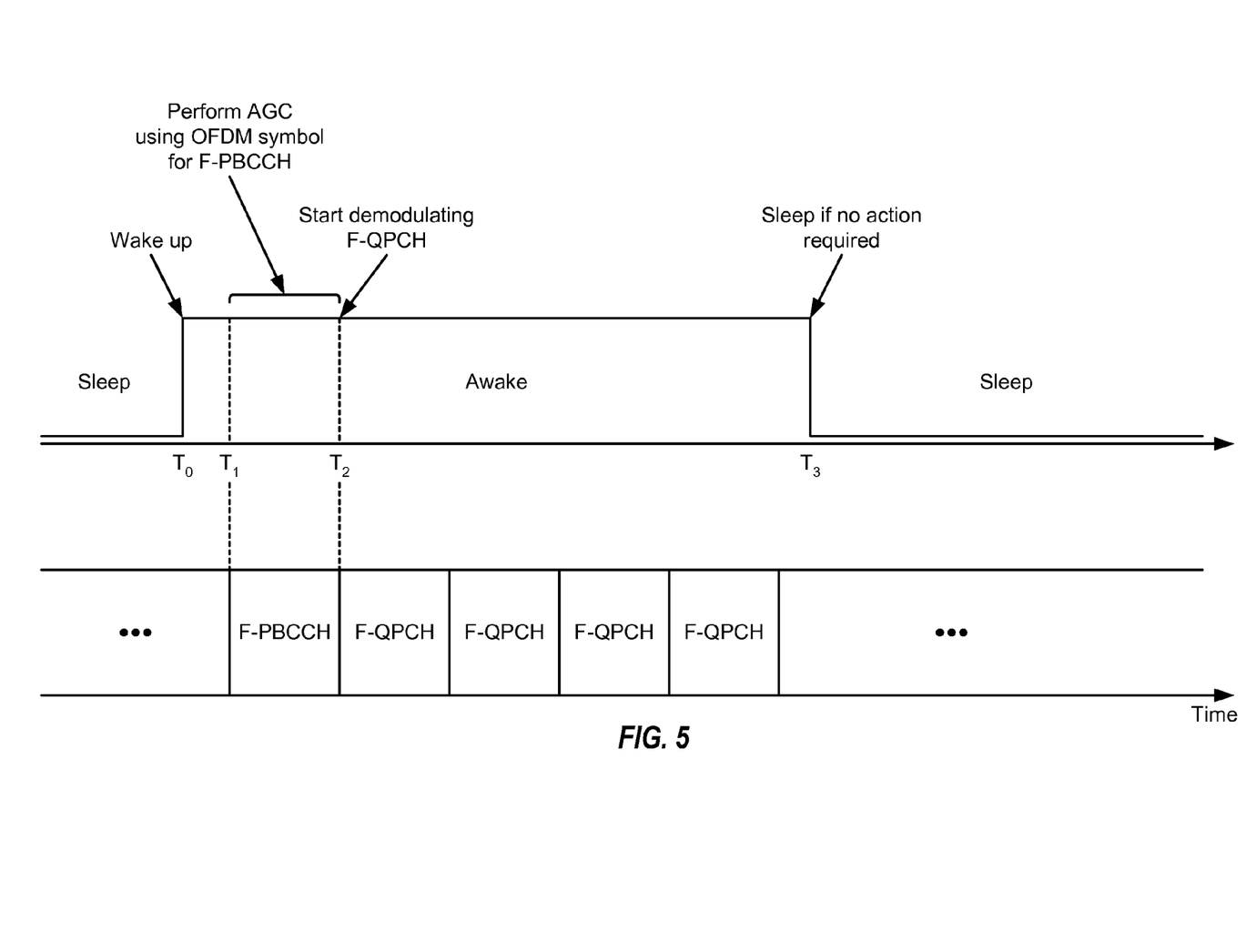
FIG. 5 shows operation of an idle terminal.

FIG. 5 shows operation of an idle terminal in accordance with one design. The terminal may wake up at time $T_0$ prior to the start of the preamble for an assigned superframe and may warm up its receiver. The terminal may operate an AGC loop to set the gain of the receiver. For the current awake interval, the terminal may initialize the AGC loop to the last receiver gain determined during the prior awake interval. The terminal may measure the received power of the OFDM symbol for the F-PBCCH starting at time $T_1$ and may set the receiver gain such that a proper signal level can be obtained for this OFDM symbol. The terminal may use a short time constant, relative to the OFDM symbol duration, so that the AGC loop can converge within one OFDM symbol period. At time $T_2$, which is the start of the first OFDM symbol for the F-QPCH, the terminal may demodulate the F-QPCH to obtain paging information. At time $T_3$, the terminal may determine that no action is required based on the received paging information and may go to sleep until the next assigned superframe. Prior to going to sleep, the terminal may save the last receiver gain for the current awake interval, which may be used as an initial receiver gain for the next awake interval. The terminal may repeat the same processing for each assigned superframe.

In the design shown in FIGS. 4 and 5, the F-PBCCH is sent immediately before the F-QPCH, and the OFDM symbol for the F-PBCCH may be used as a reference for AGC purpose. All of the OFDM symbols in the superframe preamble may be sent at the same or similar transmit power levels. In this case, the received power of the OFDM symbol for the F-PBCCH may be a good estimate of the received power of the OFDM symbols for the F-QPCH.

In general, a terminal may use any forward link transmission with known transmit power for AGC purpose prior to performing demodulation for paging information. If the OFDM symbols in the superframe preamble are sent with similar transmit power, then the terminal may set its AGC based on any observation in the superframe preamble prior to the paging information. The transmission right before the paging information may be used for AGC, as shown in FIG. 5. This may reduce the amount of time that the terminal is awake for each assigned superframe. However, the transmission used for AGC may also occur some amount of time prior to the paging information (not shown in FIG. 4 or 5).

For the design shown in FIGS. 4 and 5, the F-PBCCH is sent in the first OFDM symbol of the superframe preamble, and the F-QPCH is sent in consecutive OFDM symbols. The F-PBCCH and F-QPCH may also be sent in other locations of the superframe, e.g., in the middle or the end of the preamble. The F-QPCH may also be sent after one or more TDM pilots, which may be used as reference for AGC.

During initial acquisition, a terminal may demodulate the F-PBCCH to obtain the deployment-specific parameters. The OFDM symbol for the F-PBCCH may be severely distorted if it has a very different received power level than that of the OFDM symbol just before the F-PBCCH. This may occur, for example, if a base station has no users to serve in the previous PHY frame in an FDD system, or if a nearby user is transmitting on the reverse link in a TDD system. To avoid performance degradation for initial acquisition, the terminal may first detect for the TDM pilots to obtain superframe timing and may then set its AGC by averaging across multiple superframe preambles. The terminal may then have an accurate setpoint for demodulating the OFDM symbol for the F-PBCCH.

Figure 6:
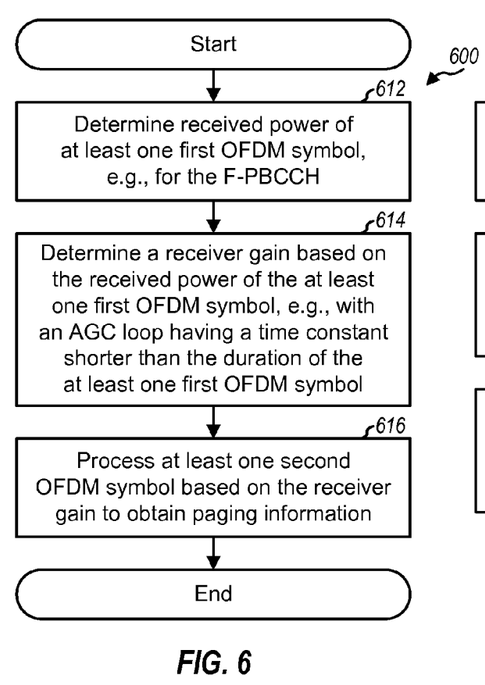
FIG. 6 shows a process performed by the terminal.

FIG. 6 shows a design of a process 600 performed by a terminal. Received power of at least one first OFDM symbol may be determined (block 612). A receiver gain may then be determined based on the received power of the at least one first OFDM symbol, e.g., with an AGC loop having a time constant that is shorter than the duration of the at least one first OFDM symbol (block 614). At least one second OFDM symbol may be processed based on the receiver gain to obtain paging information (block 616).

The at least one first OFDM symbol may comprise the F-PBCCH or some other control channel. The at least one second OFDM symbol may comprise the F-QPCH or some other paging related channel. The first and second OFDM symbols may be received in a superframe preamble. The first OFDM symbol(s) may be received either immediately prior to or some time before the second OFDM symbol(s). The first OFDM symbol(s) may be a single OFDM symbol received at the start of the superframe preamble or at some other location of the superframe preamble. The first and second OFDM symbols may be transmitted at similar or known transmit power levels.

The terminal may determine superframes assigned to the terminal while operating in an idle state. The terminal may sleep between the assigned superframes and may process the first and second OFDM symbols in each assigned superframe to obtain the paging information. The paging information may comprise terminal ID information and may indicate whether or not a page is being sent to the terminal. The paging information may also comprise paging indicators and may indicate whether a page is potentially sent to the terminal. The paging information may also comprise other paging related information, e.g., a page.

Figure 7:
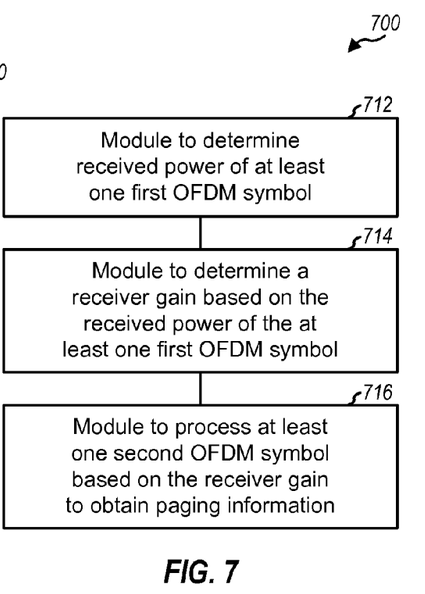
FIG. 7 shows an apparatus for the terminal.

FIG. 7 shows a design of an apparatus 700 for a terminal. Apparatus 700 includes means for determining received power of at least one first OFDM symbol (module 712), means for determining a receiver gain based on the received power of the at least one first OFDM symbol (module 714), and means for processing at least one second OFDM symbol based on the receiver gain to obtain paging information (module 716).

Figure 8:
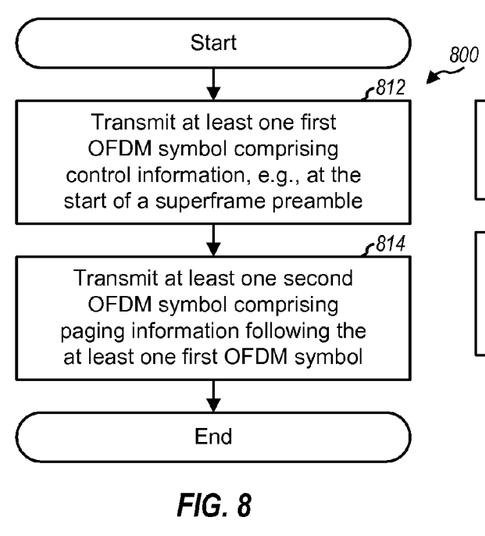
FIG. 8 shows a process performed by a base station.

FIG. 8 shows a design of a process 800 performed by a base station. At least one first OFDM symbol comprising control information may be transmitted, e.g., at the start of a superframe preamble (block 812). At least one second OFDM symbol comprising paging information may be transmitted (e.g., immediately) following the at least one first OFDM symbol (block 814). The first and second OFDM symbols may be transmitted at similar or known transmit power levels.

The first OFDM symbol(s) may be useable by idle terminals to determine receiver gain for the second OFDM symbol(s).

Figure 9:
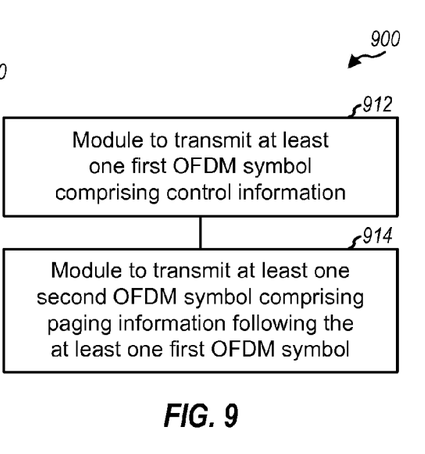
FIG. 9 shows an apparatus for the base station.

FIG. 9 shows a design of an apparatus 900 for a base station. Apparatus 900 includes means for transmitting at least one first OFDM symbol comprising control information (module 912), and means for transmitting at least one second OFDM symbol comprising paging information following the at least one first OFDM symbol (module 914).

The modules in FIGS. 7 and 9 may comprise processors, electronics devices, hardware devices, electronics components, logical circuits, memories, etc., or any combination thereof.

Figure 10:
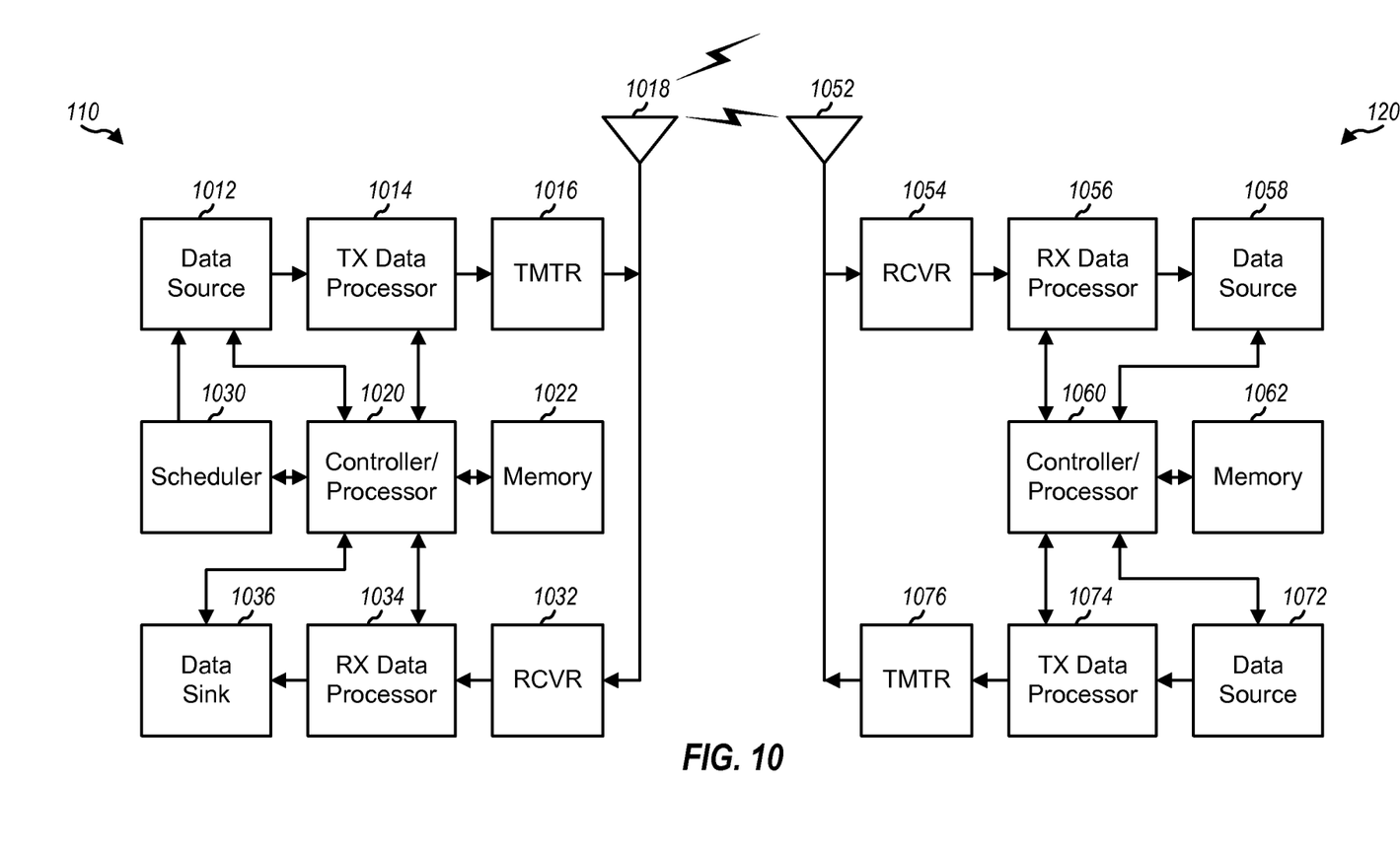
FIG. 10 shows a block diagram of the base station and the terminal.

FIG. 10 shows a block diagram of a design of a base station 110 and a terminal 120, which are one of the base stations and one of the terminals in system 100 in FIG. 1. At base station 110, a transmit (TX) data processor 1014 may receive traffic data from a data source 1012 for terminals scheduled for transmission on the forward link, control information from a controller/processor 1020, scheduling information from a scheduler 1030, etc. For example, controller/processor 1020 may provide deployment-specific information for the F-PBCCH, sector-specific information for the F-SBCCH, and paging information for the F-QPCH. Scheduler 1030 may provide assignments of resources for the scheduled terminals. The data and control information may be sent on data and control channels, respectively. TX data processor 1014 may process (e.g., encode and symbol map) the data and control information, perform modulation (e.g., for OFDM), and provide output chips. A transmitter (TMTR) 1016 may condition (e.g., convert to analog, filter, amplify, and upconvert) the output chips and generate a forward link signal, which may be transmitted via an antenna 1018.

At terminal 120, an antenna 1052 may receive the forward link signal from base station 110 and provide a received signal to a receiver (RCVR) 1054. Receiver 1054 may condition and digitize the received signal and provide samples. A received (RX) data processor 1056 may perform demodulation on the samples (e.g., for OFDM) and demodulate and decode the resultant symbols to obtain data and control information. Processor 1056 may provide decoded data to a data sink 1058 and may provide decoded control information to a controller/processor 1060. Terminal 120 may operate in the idle state and may wake up prior to the preamble of each assigned superframe. Receiver 1054 may perform AGC based on the OFDM symbol for the F-PBCCH to determine the receiver gain. Receiver 1054 may then process the OFDM symbols for the F-QPCH based on the receiver gain.

On the reverse link, a TX data processor 1074 at terminal 120 may receive traffic data from a data source 1072 and control information from controller/processor 1060. The data and control information may be processed (e.g., encoded, symbol mapped, and modulated) by TX data processor 1074 and further conditioned by a transmitter 1076 to generate a reverse link signal, which may be transmitted via antenna 1052. At base station 110, the reverse link signals from terminal 120 and other terminals may be received by antenna 1018, conditioned by a receiver 1032, and demodulated and decoded by an RX data processor 1034.

Controllers/processors 1020 and 1060 may direct the operation at base station 110 and terminal 120, respectively. Memories 1022 and 1062 may store program codes and data for base station 110 and terminal 120, respectively. Controller/processor 1020 may direct transmission of data and control information on the forward link. Controller/processor 1020 may also control transmission on the forward link such that the superframe preamble is transmitted as described herein, e.g., as shown in FIG. 4. Controller/processor 1020 may perform process 800 in FIG. 8 and/or other processes for the techniques described herein. Controller/processor 1060 may control the operation of terminal 120 in the idle state, e.g., as shown in FIG. 5. Controller/processor 1060 may perform process 600 in FIG. 6 and/or other processes for the techniques described herein.

The techniques described herein may be implemented by various means. For example, these techniques may be implemented in hardware, firmware, software, or a combination thereof. For a hardware implementation, the processing units at an entity (e.g., a terminal or a base station) may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with code (e.g., procedures, functions, instructions, etc.) that may be executed by one or more processors to perform the functions described herein. In general, any machine/computer/processor-readable medium tangibly embodying firmware and/or software code may be used in implementing the techniques described herein. For example, the code may be stored in a memory (e.g., memory 1022 or 1062 in FIG. 10) and executed by a processor (e.g., processor 1020 or 1060). The memory may be implemented within the processor or external to the processor. The code may also be stored in a computer/processor-readable medium such as random access memory (RAM), read-only memory (ROM), non-volatile random access memory (NVRAM), programmable read-only memory (PROM), electrically erasable PROM (EEPROM), FLASH memory, floppy disk, compact disc (CD), digital versatile disc (DVD), magnetic or optical data storage device, etc. The code may be executable by one or more processors and may cause the processor(s) to perform certain aspects of the functionality described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
   at least one processor configured to determine received power of at least one first orthogonal frequency division multiplexed (OFDM) symbol comprising a control channel, to determine a receiver gain based on the received power of the at least one first OFDM symbol, to process at least one second OFDM symbol based on the receiver gain to obtain paging information, the second OFDM symbol comprising at least a paging channel, to determine superframes assigned to a terminal operating in an idle state, to sleep between the assigned superframes, and to process the at least one first OFDM symbol and the at least one second OFDM symbol in each assigned superframe to obtain the paging information; and
   a memory coupled to the at least one processor.

2. The apparatus of claim 1, wherein the at least one processor is configured to determine the receiver gain based on an automatic gain control (AGC) loop having a time constant shorter than duration of the at least one first OFDM symbol.

3. The apparatus of claim 2, wherein the at least one processor is configured to initialize the AGC loop with a receiver gain saved from a prior awake interval, and to save the receiver gain for current awake interval for use in a next awake interval.

4. The apparatus of claim 1, wherein the at least one processor is configured to receive the at least one first OFDM symbol and the at least one second OFDM symbol in a superframe preamble.

5. The apparatus of claim 1, wherein the at least one first OFDM symbol and the at least one second OFDM symbol are transmitted at similar or known transmit power levels.

6. The apparatus of claim 1, wherein the at least one processor is configured to receive the at least one first OFDM symbol immediately prior to the at least one second OFDM symbol.

7. The apparatus of claim 1, wherein the at least one processor is configured to receive a single OFDM symbol for the at least one first OFDM symbol at start of a superframe preamble, the single OFDM symbol carrying control information for a wireless communication system.

8. The apparatus of claim 7, wherein the at least one processor is configured to receive four consecutive OFDM symbols for the at least one second OFDM symbol immediately following the single OFDM symbol.

9. The apparatus of claim 1, wherein the paging information indicates whether a page is being sent to the terminal.

10. The apparatus of claim 1, wherein the paging information comprises paging indicators, and wherein the at least one processor is configured
to determine whether a page is potentially sent to the terminal based on the paging indicators.

11. The apparatus of claim 1, wherein the at least one processor is configured to process at least one third OFDM symbol for at least one acquisition pilot based on the receiver gain.

12. The apparatus of claim 1, wherein the at least one first OFDM symbol comprises a Forward Primary Broadcast Control Channel (F-PBCCH) and the at least one second OFDM symbol comprises a Forward Quick Paging Channel (F-QPCH).

13. A method for wireless communication, comprising:
determining received power of at least one first orthogonal frequency division multiplexed (OFDM) symbol comprising a control channel;
determining a receiver gain based on the received power of the at least one first OFDM symbol;
processing at least one second OFDM symbol based on the receiver gain to obtain paging information, the second OFDM symbol comprising at least a paging channel;
determining superframes assigned to a terminal operating in an idle state;
sleeping between the assigned superframes; and
processing the at least one first OFDM symbol and the at least one second OFDM symbol in each assigned superframe to obtain the paging information.

14. The method of claim 13, wherein the determining the receiver gain comprises determining the receiver gain based on an automatic gain control (AGC) loop having a time constant shorter than duration of the at least one first OFDM symbol.

15. The method of claim 13, further comprising:
receiving a single OFDM symbol for the at least one first OFDM symbol immediately prior to the at least one second OFDM symbol.

16. The method of claim 13, further comprising:
determining whether a page is being sent to the terminal or is potentially sent to the terminal based on the paging information.

17. An apparatus for wireless communication, comprising:
means for determining received power of at least one first orthogonal frequency division multiplexed (OFDM) symbol comprising a control channel;
means for determining a receiver gain based on the received power of the at least one first OFDM symbol;
means for processing at least one second OFDM symbol based on the receiver gain to obtain paging information, the second OFDM symbol comprising at least a paging channel;
means for determining superframes assigned to a terminal operating in an idle state;
means for sleeping between the assigned superframes; and
means for processing the at least one first OFDM symbol and the at least one second OFDM symbol in each assigned superframe to obtain the paging information.

18. The apparatus of claim 17, wherein the means for determining the receiver gain comprises means for determining the receiver gain based on an automatic gain control (AGC) loop having a time constant shorter than duration of the at least one first OFDM symbol.

19. The apparatus of claim 17, further comprising:
means for receiving a single OFDM symbol for the at least one first OFDM symbol immediately prior to the at least one second OFDM symbol.

20. The apparatus of claim 17, further comprising:
means for determining whether a page is being sent to the terminal or is potentially sent to the terminal based on the paging information.

21. A computer program product, comprising:
a computer-readable medium comprising:
code for causing at least one computer to determine received power of at least one first orthogonal frequency division multiplexed (OFDM) symbol comprising a control channel;
code for causing the at least one computer to determine a receiver gain based on the received power of the at least one first OFDM symbol;
code for causing the at least one computer to process at least one second OFDM symbol based on the receiver gain to obtain paging information, the second OFDM symbol comprising at least a paging channel;
code for causing the at least one computer to determine superframes assigned to a terminal operating in an idle state;
code for causing the at least one computer to sleep between the assigned superframes; and
code for causing the at least one computer to process the at least one first OFDM symbol and the at least one second OFDM symbol in each assigned superframe to obtain the paging information.

22. An apparatus for wireless communication, comprising:
at least one processor configured to transmit at least one first orthogonal frequency division multiplexed (OFDM) symbol comprising a control channel, and to transmit at least one second OFDM symbol comprising paging information in at least a paging channel following the at least one first OFDM symbol, wherein the at least one first OFDM symbol and the at least one second OFDM symbol are transmitted at similar or known transmit power levels, and wherein the at least one first OFDM symbol is useable by terminals to determine receiver gain for the at least one second OFDM symbol; and a memory coupled to the at least one processor, wherein the at least one first OFDM symbol comprises a Forward Primary Broadcast Control Channel (F-PBCCH) and the at least one second OFDM symbol comprises a Forward Quick Paging Channel (F-QPCH).

23. The apparatus of claim 22, wherein the at least one processor is configured to transmit a single OFDM symbol for the at least one first OFDM symbol at start of a superframe preamble, and to transmit the at least one second OFDM symbols immediately following the single OFDM symbol.

24. The apparatus of claim 22, wherein the at least one processor is configured to transmit at least one third OFDM symbol for at least one acquisition pilot following the at least one second OFDM symbol.

25. The apparatus of claim 22, wherein the paging information identifies at least one terminal for which a page is being sent or is potentially sent.

26. A method for wireless communication, comprising:

transmitting at least one first orthogonal frequency division multiplexed (OFDM) symbol comprising a control channel; and transmitting at least one second OFDM symbol comprising paging information in at least a paging channel following the at least one first OFDM symbol, wherein the at least one first OFDM symbol and the at least one second OFDM symbol are transmitted at similar or known transmit power levels, and wherein the at least one first OFDM symbol is useable by terminals to determine receiver gain for the at least one second OFDM symbol, wherein the at least one first OFDM symbol comprises a Forward Primary Broadcast Control Channel (F-PBCCH) and the at least one second OFDM symbol comprises a Forward Quick Paging Channel (F-QPCH).

27. The method of claim 26, wherein the transmitting the at least one first OFDM symbol comprises transmitting a single OFDM symbol for the at least one first OFDM symbol at start of a superframe preamble, and wherein the transmitting the at least one second OFDM symbol comprises transmitting the at least one second OFDM symbols immediately following the single OFDM symbol.

28. An apparatus for wireless communication, comprising:

means for transmitting at least one first orthogonal frequency division multiplexed (OFDM) symbol comprising a control channel; and means for transmitting at least one second OFDM symbol comprising paging information in at least a paging channel following the at least one first OFDM symbol, wherein the at least one first OFDM symbol and the at least one second OFDM symbol are transmitted at similar or known transmit power levels, and wherein the at least one first OFDM symbol is useable by terminals to determine receiver gain for the at least one second OFDM symbol, wherein the at least one first OFDM symbol comprises a Forward Primary Broadcast Control Channel (F-PBCCH) and the at least one second OFDM symbol comprises a Forward Quick Paging Channel (F-QPCH).

29. The apparatus of claim 28, wherein the means for transmitting the at least one first OFDM symbol comprises means for transmitting a single OFDM symbol for the at least one first OFDM symbol at start of a superframe preamble, and wherein the means for transmitting the at least one second OFDM symbol comprises means for transmitting the at least one second OFDM symbols immediately following the single OFDM symbol.

30. A computer program product, comprising:

a computer-readable medium comprising:

code for causing at least one computer to transmit at least one first orthogonal frequency division multiplexed (OFDM) symbol comprising a control channel; and code for causing the at least one computer to transmit at least one second OFDM symbol comprising paging information in at least a paging channel following the at least one first OFDM symbol, wherein the at least one first OFDM symbol and the at least one second OFDM symbol are transmitted at similar or known transmit power levels, and wherein the at least one first OFDM symbol is useable by terminals to determine receiver gain for the at least one second OFDM symbol, wherein the at least one first OFDM symbol comprises a Forward Primary Broadcast Control Channel (F-PBCCH) and the at least one second OFDM symbol comprises a Forward Quick Paging Channel (F-QPCH).

* * * * *